United States Patent
Shibata

(10) Patent No.: US 7,935,615 B2
(45) Date of Patent: May 3, 2011

(54) III-V NITRIDE SEMICONDUCTOR SUBSTRATE AND ITS PRODUCTION METHOD

(75) Inventor: Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 307 days.

(21) Appl. No.: 11/856,926

(22) Filed: Sep. 18, 2007

(65) Prior Publication Data

US 2008/0014723 A1    Jan. 17, 2008

Related U.S. Application Data

(62) Division of application No. 10/813,176, filed on Mar. 31, 2004, now Pat. No. 7,288,830.

(30) Foreign Application Priority Data

Aug. 28, 2003  (JP) .................. 2003-304078
Oct. 16, 2003  (JP) .................. 2003-356699

(51) Int. Cl.
  *H01L 21/20* (2006.01)
(52) U.S. Cl. ...... 438/481; 438/49; 257/11; 257/E21.097
(58) Field of Classification Search .............. 438/481, 438/49; 257/11, E21.097
See application file for complete search history.

(56) References Cited

U.S. PATENT DOCUMENTS

| 5,679,152 | A * | 10/1997 | Tischler et al. .............. 117/97 |
| 6,447,604 | B1  | 9/2002  | Flynn et al. |
| 6,773,504 | B2  | 8/2004  | Motoki et al. |
| 7,170,095 | B2 * | 1/2007 | Vaudo et al. ................ 257/76 |
| 2002/0046693 | A1 | 4/2002 | Kiyoku et al. |
| 2003/0070607 | A1 | 4/2003 | Koike et al. |
| 2003/0134493 | A1 | 7/2003 | Cho et al. |

FOREIGN PATENT DOCUMENTS

| EP | 1246233 A2 | 10/2002 |
| JP | 2001-122693 A | 5/2001 |
| JP | 2002-373864 A | 12/2002 |
| JP | 2003-178984 A | 6/2003 |

OTHER PUBLICATIONS

Yihwan Kim, et al; Growth and Evaluation of GAN Thick Films; Department of Materials Science and Mineral Engineering; Final Report 1998-1999 for MICRO Project 98-168; Industrial Sponsor: American X-tal Technology (AXT).

* cited by examiner

*Primary Examiner* — Matthew C Landau
*Assistant Examiner* — Sonya D McCall Shepard
(74) *Attorney, Agent, or Firm* — Sughrue Mion, PLLC

(57) ABSTRACT

A self-supported III-V nitride semiconductor substrate having a substantially uniform carrier concentration distribution in a surface layer existing from a top surface to a depth of at least 10 μm is produced by growing a III-V nitride semiconductor crystal while forming a plurality of projections on a crystal growth interface at the initial or intermediate stage of crystal growth; conducting the crystal growth until recesses between the projections are buried, so that the crystal growth interface becomes flat; and continuing the crystal growth to a thickness of 10 μm or more while keeping the crystal growth interface flat.

16 Claims, 9 Drawing Sheets

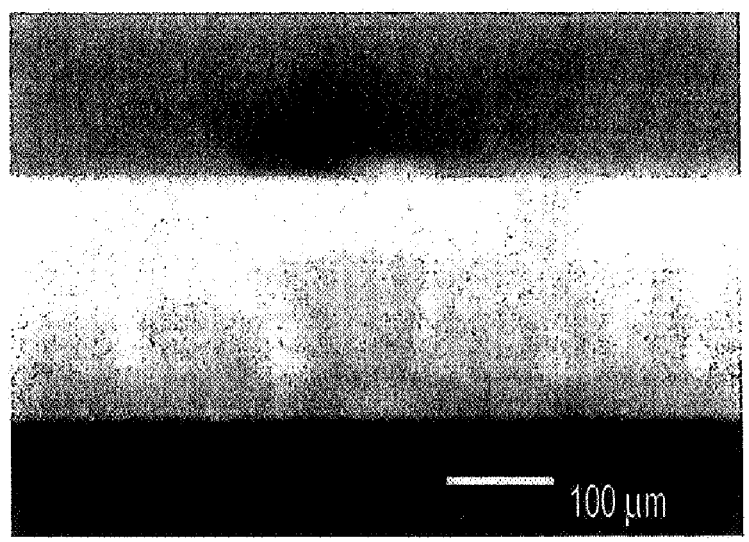
FIG. 3
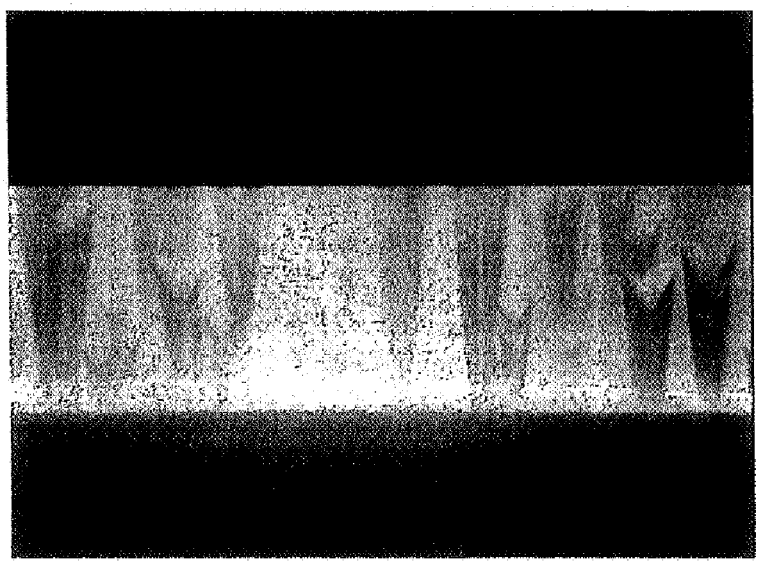

III-V NITRIDE SEMICONDUCTOR SUBSTRATE AND ITS PRODUCTION METHOD

CROSS REFERENCE TO RELATED APPLICATIONS

This is a Divisional of application Ser. No. 10/813,176 filed Mar. 31, 2004, now U.S. Pat. No. 7,288,830 which claims priority to JP 2003-304078 filed Aug. 28, 2003 and JP 2003-356699 filed Oct. 16, 2003.

FIELD OF THE INVENTION

The present invention relates to a III-V nitride semiconductor substrate having a low dislocation density and a substantially uniform surface carrier concentration distribution, and a method for producing it.

BACKGROUND OF THE INVENTION

Because nitride semiconductor materials have sufficiently wide forbidden bands with direct interband transition, their applications to short-wavelength light-emitting devices have been widely investigated. In addition, because of a large saturated drift velocity of electrons and the usability of a two-dimensional carrier gas in heterojunctions, their applications to electron devices are expected.

Nitride semiconductor layers for constituting these devices are obtained by epitaxial growth on base substrates by vapor phase growth methods such as a metal-organic vapor-phase epitaxy method (MOVPE), a molecular beam epitaxy method (MBE), a hydride vapor-phase epitaxy method (HVPE), etc. However, because there are no base substrates having lattice constants matched to those of the nitride semiconductor layers, it is difficult to grow high-quality layers, resulting in nitride semiconductor layers with a lot of crystal defects. Because the crystal defects hinder devices from having improved characteristics, investigation has been vigorously carried out so far to reduce the crystal defects in the nitride semiconductor layers.

Known as a method for producing group-III nitride crystals with relatively few crystal defects is a method in which a low-temperature-deposited layer (buffer layer) is formed on a different substrate such as sapphire, etc., and an epitaxially grown layer is formed thereon. In a crystal-growing method using a low-temperature-deposited layer, AlN or GaN is deposited on a substrate of sapphire, etc. at about 500° C., and an amorphous or partially polycrystalline, continuous film is formed. The film is heated to about 1000° C. to cause partial evaporation or crystallization, thereby forming high-density crystal nuclei, which are used as growth nuclei to obtain a GaN film with relatively good crystallinity. Even by the method of forming the low-temperature-deposited layer, however, the resultant substrates are filled with considerable numbers of crystal defects such as threading dislocations, vacancies, etc., insufficient for obtaining presently demanded high-performance devices.

In view of the above circumstances, investigation has been intensively carried out to obtain methods of using a GaN substrate as a substrate, from which a crystal grows, and forming a multi-layered semiconductor film, on which devices are formed, on the GaN substrate. The GaN substrate for crystal growth is referred to herein as a self-supported GaN substrate. The epitaxial lateral overgrowth (ELO) technology is known as a method for forming a self-supported GaN substrate. The ELO method is a technology of forming a GaN layer with few dislocations by laterally growing the GaN layer on a base substrate in openings of a mask formed thereon. JP 11-251253 A discloses the production of a self-supported GaN substrate by forming a GaN layer on a sapphire substrate by this ELO method and then removing the sapphire substrate by etching, etc.

A facet-initiated epitaxial lateral overgrowth (FIELO) method (A. Usui, et al., Jpn. J. Appl. Phys. Vol. 36 (1997) pp. L.899-L.902) has evolved from the ELO method. The FIELO method is different from the ELO method in forming facets in openings of a silicon oxide mask in the selective growth of GaN. The facets change the propagation direction of dislocations, thereby reducing the number of threading dislocations reaching the top surface of the epitaxially grown layer. The growth of a thick GaN layer on a base substrate of sapphire, etc. by the FIELO method and the removal of the base substrate thereafter can provide a high-quality, self-supported GaN substrate with relatively few crystal defects.

As a method for forming a low-dislocation, self-supported GaN substrate, a method of dislocation elimination by the epi-growth with inverted-pyramidal pits (DEEP method) has been developed (K. Motoki et. al., Jpn. J. Appl. Phys. Vol. 40, JP 2003-165799 A). The DEEP method intentionally forms a plurality of pits surrounded by facet planes on a crystal surface by growing GaN with a mask of silicon nitride, etc. patterned on a GaAs substrate, and concentrates dislocations at the bottom of the pits to lower a dislocation density in other regions.

In an as-grown state, the GaN substrate obtained by the ELO method or the DEEP method usually has morphology such as pits, hillocks, etc. on its surface, resulting in difficulty in growing an epitaxial layer for producing devices without further treatment. Therefore, the top surface of the substrate is generally mirror-polished before devices are produced thereon.

In such circumstances, JP 2003-178984 A proposes a method for producing a group-III nitride semiconductor substrate having a low dislocation density, which comprises the steps of forming a metal film on a base substrate composed of a sapphire substrate and a first group-III nitride semiconductor layer deposited thereon, or on a base substrate made of a first group-III nitride semiconductor; heat-treating the base substrate in an atmosphere comprising a hydrogen gas or a hydrogen-containing compound gas to form voids in the first group-III nitride semiconductor layer; and forming a second group-III nitride semiconductor layer on the metal film. JP 2003-178984 A describes in Example 14 and FIG. 16 a self-supported GaN substrate, whose fluorescent photomicrograph in the cross section shows no black stripes but substantially uniform black portions near an peeling interface with the sapphire substrate. With respect to this phenomenon, JP 2003-178984 A describes that increase in the amount of hydrogen in a carrier gas suppresses defects from growing to the surface.

It has been found, however, that the self-supported GaN substrate produced by such a method has a nonuniform carrier concentration on its surface despite the lowered dislocation density. The nonuniform carrier concentration distribution on its substrate surface is a problem that has never occurred in conventionally used semiconductor substrates of Si and GaAs because of their production methods. In the self-supported GaN substrate, however, there may be locally nonuniform regions in the carrier concentration because an epitaxially grown thick crystal layer is used as the substrate. When crystal growth is carried out while forming facets in a growth interface, to lower the dislocation of the self-supported GaN substrate, there inevitably occurs difference between facet planes and other planes, resulting in different rates of crystal growth and thus differences in effective segregation coefficients of impurities therebetween, which leads to the nonuniform impurity distributions, namely variations in the carrier concentrations. Because regions with different carrier concentrations appear as the hysteresis of facet-grown regions, they are distributed such that they extend in a crystal growth direction. If the regions with different carrier concentrations reached the top surface of the substrate, variations in the carrier concentration would inevitably occur on the top surface of the substrate.

It has been found that when there are regions having nonuniform carrier concentrations on the surface of the GaN substrate, epitaxial GaN layers grown on such regions are prone to have large surface roughness. Namely, even if an underlying GaN substrate is mirror-polished, there occurs a phenomenon that the resultant epitaxial layer has a rough surface. Without an epitaxial GaN layer having a uniform surface morphology, the characteristics of devices formed thereon would suffer from deterioration, variations, etc.

When a crystal grows while forming pits surrounded by facet planes in crystal growth interfaces, dislocations are concentrated in the bottoms of the pits. All accumulated dislocations are not necessarily integrated, but form high-dislocation regions expanding without clear boundaries. In regions in which dislocations are concentrated without clear boundaries, it is considered that regions locally having nonuniform carrier concentration distributions are formed by the diffusion of impurities.

Even in GaN crystals, in which the concentrations of dislocations in the bottoms of the pits are suppressed, nonuniform carrier concentration distributions may occur on their surfaces. If epitaxial GaN layers were caused to grow on such GaN crystal substrates, ragged morphologies would appear on their surfaces, whose roughness is not substantially different from that of GaN substrates with dislocation-concentrated regions. This suggests that the roughness of the epitaxial surface is caused not by a dislocation density distribution but by a local distribution of the carrier concentration.

If the growth of facets were terminated by increasing the amount of hydrogen in a carrier gas as in JP 2003-178984 A, or by changing crystal growth conditions in the course of crystal growth, it might be considered that a crystal growth interface becomes flat, resulting in a uniform surface carrier concentration distribution. However, because there has never conventionally been a concept of substantially uniformly controlling the carrier concentration distribution on the top surface of the substrate, the polishing of a substrate surface removes even regions having a uniform carrier concentration distribution, resulting in the likelihood that there are large variations in the carrier concentration on the mirror-finished substrate surface. No investigation has conventionally been conducted as to how thick a surface layer having a uniform carrier concentration distribution should be. Accordingly, even if a GaN substrate with a surface layer having a uniform carrier concentration distribution were produced, the mirror-finishing treatment would likely remove almost the entire surface layer or make it too thin. It has thus been impossible to stably produce a low-dislocation GaN substrate having small variations of a carrier concentration on the surface and providing devices formed thereon with no defects.

OBJECTS OF THE INVENTION

Accordingly, an object of the present invention is to provide a self-supported substrate made of a III-V nitride semiconductor having a sufficiently thick surface layer with a low dislocation density and reduced variations in a carrier concentration.

Another object of the present invention is to provide a method for producing such a self-supported substrate.

SUMMARY OF THE INVENTION

As a result of intense research in view of the above objects, the inventor has found that (a) not only a uniformly reduced dislocation density but also a high in-plane uniformity of carrier concentration are important in a III-V nitride semiconductor substrate, on which light-emitting devices having uniform characteristics are formed with a good yield; that (b) when the III-V nitride semiconductor substrate has a surface layer (at least up to a depth of 10 µm) having a substantially uniform carrier concentration distribution, an epitaxial GaN layer grown on the substrate is provided with uniform surface morphology and properties; and that (c) when the surface layer having a substantially uniform carrier concentration is thinner than 10 µm, an epitaxial GaN layer grown on the surface layer is provided with a rough surface morphology and a nonuniform composition of compound semiconductor crystal, which reflects the carrier concentration distribution of the substrate.

When facets are caused to appear in a growth interface in the initial stage of growing a III-V nitride semiconductor substrate to bend the propagation directions of dislocations thereby reducing the number of dislocations reaching the top surface of the substrate, and when the growth interface becomes flat in the course of the crystal growth, it is possible to grow a substrate having a uniform surface carrier concentration distribution without increasing a dislocation density. Though effective for flattening the growth interface is to increase a partial pressure of hydrogen in a carrier gas in the course of the vapor phase growth, the growth interface can be made flat without changing growth conditions in the course of the crystal growth process when the partial pressures of hydrogen and GaCl are relatively high since the initial stage of crystal growth. The growth interface may also become flat by adding impurities such as Mg, etc. for accelerating the growth of the III-V nitride semiconductor in lateral directions.

The present invention, which has been achieved based on the above findings, is to provide a III-V nitride semiconductor substrate having few dislocations and a uniform surface (in-plane) carrier concentration distribution, on which an epitaxial GaN layer with high crystallinity and uniformity can grow, and a method for producing such a III-V nitride semiconductor substrate.

Thus, the self-supported III-V nitride semiconductor substrate of the present invention has a substantially uniform carrier concentration distribution at least on the outermost surface, namely the top surface, thereof.

The self-supported III-V nitride semiconductor substrate according to the first embodiment of the present invention has a substantially uniform carrier concentration distribution in a surface layer existing from the top surface to a depth of at least 10 µm.

The self-supported III-V nitride semiconductor substrate according to the second embodiment of the present invention comprises a first layer having a plurality of regions different in a carrier concentration from their surroundings in a direction substantially perpendicular to a substrate surface, and a second layer existing from the top surface to a depth of at least 10 µm, the second layer being substantially free from the regions with different carrier concentrations, thereby having a substantially uniform carrier concentration distribution.

The self-supported III-V nitride semiconductor substrate according to the third embodiment of the present invention does not have clear boundaries between high-brightness regions and low-brightness regions in a fluorescence photomicrograph of its surface layer existing from the top surface to a depth of at least 10 μm.

The self-supported III-V nitride semiconductor substrate according to the fourth embodiment of the present invention comprises a first layer having high-brightness regions and low-brightness regions with clear boundaries and a second layer composed of a high-brightness region from the top surface to a depth of at least 10 μm in a fluorescence photomicrograph in its arbitrary cross section, the low-brightness regions and the high-brightness regions being different in a carrier concentration.

The self-supported III-V nitride semiconductor substrate according to the fifth embodiment of the present invention comprises substantially no regions different in a carrier concentration from their surroundings in a surface layer existing from the top surface to a depth of at least 10 μm.

When the substrate has a carrier concentration of $1 \times 10^{17}$ $cm^{-3}$ or more, variations in the carrier concentration in the outermost surface (or the surface layer or the second layer) are preferably within ±25%. When the substrate has a carrier concentration of less than $1 \times 10^{17}$ $cm^{-3}$, variations in the carrier concentration are preferably within ±100% in the outermost surface (or the surface layer or the second layer). Variations in the carrier concentration are preferably not larger on its top surface than on its bottom surface. Herein, variations in the carrier concentration can be expressed by (a) (maximum value–minimum value)/average value of the carrier concentration, (b) deviation from the average value of the carrier concentration, (c) the standard deviation of the carrier concentration, etc. Variations in the carrier concentration herein are those calculated by (a) (maximum value–minimum value)/average value, unless otherwise described.

The regions with different carrier concentrations are, for instance, substantially in a planar shape with a wedge-like cross section, or in a shape of a cone, a hexagonal pyramid or a dodecahedral pyramid. The regions with different carrier concentrations preferably have the maximum width of 1 mm or less.

The top surface or top and bottom surfaces of the III-V nitride semiconductor substrate of the present invention are preferably polished.

The III-V nitride semiconductor substrate of the present invention preferably has a thickness of 200 μm to 1 mm.

The top surface of the III-V nitride semiconductor substrate of the present invention is preferably a (0001) group-III surface.

The III-V nitride semiconductor substrate of the present invention preferably has a dislocation density lower on a top surface than on a bottom surface.

The III-V nitride semiconductor substrate of the present invention preferably comprises a layer composed of GaN or AlGaN. The III-V nitride semiconductor crystal is preferably doped with an impurity.

In the III-V nitride semiconductor substrate of the present invention, at least part of a III-V nitride semiconductor crystal is preferably grown by an HVPE method.

The production method of the III-V nitride semiconductor substrate according to the first embodiment of the present invention comprises the steps of growing a III-V nitride semiconductor crystal while forming a plurality of projections on a crystal growth interface at the initial or intermediate stage of crystal growth; conducting the crystal growth until recesses between the projections are buried, so that the crystal growth interface becomes flat; and continuing the crystal growth to a thickness of 10 μm or more while keeping the crystal growth interface flat.

The production method of the III-V nitride semiconductor substrate according to the second embodiment of the present invention comprises the steps of (a) forming a first layer having a nonuniform carrier concentration distribution, by growing a III-V nitride semiconductor crystal while forming a plurality of projections on a crystal growth interface at the initial or intermediate stage of crystal growth, and by further conducting the crystal growth until recesses between the projections are buried, so that the crystal growth interface becomes flat; and (b) forming a second layer having a substantially uniform carrier concentration distribution to a thickness of 10 μm or more by continuing the crystal growth while keeping the crystal growth interface flat.

The production method of the III-V nitride semiconductor substrate according to the third embodiment of the present invention comprises the steps of (a) forming a first layer having a nonuniform carrier concentration distribution, by growing a III-V nitride semiconductor crystal while forming a plurality of projections on a crystal growth interface at the initial or intermediate stage of crystal growth, and by further conducting the crystal growth until recesses between the projections are buried, so that the crystal growth interface becomes flat; (b) forming a second layer having a substantially uniform carrier concentration distribution by continuing the crystal growth while keeping the crystal growth interface flat; and (c) polishing a top surface of the substrate after the completion of the crystal growth, such that a remaining second layer has a thickness of 10 μm or more.

The production method of the III-V nitride semiconductor substrate according to the fourth embodiment of the present invention comprises the steps of forming a III-V nitride semiconductor layer on a top surface of a different substrate by epitaxial growth, and then separating the III-V nitride semiconductor layer from the different substrate, wherein crystal growth is conducted while forming a plurality of projections on a crystal growth interface at the initial or intermediate stage of growing the III-V nitride semiconductor layer; wherein crystal growth is then conducted until recesses between the projections are buried, so that the crystal growth interface becomes flat; and wherein crystal growth is further continued to a thickness of 10 μm or more while keeping the crystal growth interface flat.

The production method of the III-V nitride semiconductor substrate according to the fifth embodiment of the present invention comprises the steps of forming a III-V nitride semiconductor layer on a top surface of a different substrate by epitaxial growth, and separating the III-V nitride semiconductor layer from the different substrate, (a) wherein a first layer having a nonuniform carrier concentration distribution is formed by conducting crystal growth while forming a plurality of projections on a crystal growth interface at the initial or intermediate stage of growing the III-V nitride semiconductor layer, and by further conducting crystal growth until recesses between the projections are buried, so that the crystal growth interface becomes flat; and (b) wherein a second layer having a substantially uniform carrier concentration distribution is formed to a thickness of 10 μm or more by continuing the crystal growth while keeping the crystal growth interface flat.

The production method of the III-V nitride semiconductor substrate according to the sixth embodiment of the present invention comprises the steps of forming a III-V nitride semiconductor layer on a top surface of a different substrate by epitaxial growth, and then separating the III-V nitride semiconductor layer from the different substrate, (a) wherein a first layer having a nonuniform carrier concentration distribution is formed, by conducting crystal growth while forming a plurality of projections on a crystal growth interface at the initial or intermediate stage of growing the III-V nitride semiconductor layer, and by further conducting the crystal growth until recesses between the projections are buried, so that the crystal growth interface becomes flat; (b) wherein a second layer having a substantially uniform carrier concentration distribution is formed by continuing the crystal growth while keeping the crystal growth interface flat; and (c) wherein a top surface of the substrate is polished after the completion of the crystal growth, such that a remaining second layer has a thickness of 10 µm or more.

The production method of the III-V nitride semiconductor substrate according to the seventh embodiment of the present invention comprises the steps of (a) forming a first layer having a nonuniform carrier concentration distribution, by growing a III-V nitride semiconductor crystal while forming a plurality of projections on a crystal growth interface at the initial or intermediate stage of crystal growth, and by further growing the crystal until recesses between the projections are buried, so that the crystal growth interface becomes flat; (b) forming a second layer having a substantially uniform carrier concentration distribution by continuing the crystal growth while keeping the crystal growth interface flat; and (c) removing at least part of the first layer grown while forming a plurality of projections on a crystal growth interface, after the completion of the crystal growth.

The production method of the III-V nitride semiconductor substrate according to the eighth embodiment of the present invention comprises the steps of forming a III-V nitride semiconductor layer on a top surface of a different substrate by epitaxial growth, and then separating the III-V nitride semiconductor layer from the different substrate, (a) wherein a first layer having a nonuniform carrier concentration distribution is formed, by growing the III-V nitride semiconductor crystal layer while forming a plurality of projections on a crystal growth interface at the initial or intermediate stage of crystal growth, and by further conducting the crystal growth until recesses between the projections are buried, so that the crystal growth interface becomes flat; (b) wherein a second layer having a substantially uniform carrier concentration distribution is formed by continuing the crystal growth while keeping the crystal growth interface flat; and (c) wherein at least part of the first layer, which is grown while forming a plurality of projections on a crystal growth interface, is removed after the completion of the crystal growth.

The production method of the III-V nitride semiconductor substrate according to the ninth embodiment of the present invention comprises the steps of (a) forming a first layer having a nonuniform carrier concentration distribution, by growing a III-V nitride semiconductor crystal while forming a plurality of projections on a crystal growth interface at the initial or intermediate stage of crystal growth, and by further conducting the crystal growth until recesses between the projections are buried, so that the crystal growth interface becomes flat; (b) forming a thick second layer having a substantially uniform carrier concentration distribution by continuing the crystal growth for a long period of time while keeping the crystal growth interface flat; and (c) cutting the second layer in a direction perpendicular to the crystal growth after the completion of the crystal growth, thereby obtaining a crystal substrate.

The production method of the III-V nitride semiconductor substrate according to the tenth embodiment of the present invention comprises the steps of forming a III-V nitride semiconductor layer on a top surface of a different substrate by epitaxial growth, and then separating the III-V nitride semiconductor layer from the different substrate, (a) wherein a first layer having a nonuniform carrier concentration distribution is formed, by growing the III-V nitride semiconductor layer while forming a plurality of projections on a crystal growth interface at the initial or intermediate stage of crystal growth, and by further conducting crystal growth until recesses between the projections are buried, so that the crystal growth interface becomes flat; (b) wherein a thick second layer having a substantially uniform carrier concentration distribution is formed by continuing the crystal growth for a long period of time while keeping the crystal growth interface flat; and (c) wherein the second layer is cut in a direction perpendicular to the crystal growth after the completion of the crystal growth, thereby obtaining a crystal substrate.

In the production methods according to the seventh and eighth embodiments, it is preferable that at least part of the first layer, which is grown while forming a plurality of projections on a crystal growth interface, is removed by polishing the bottom surface of the substrate, so that the thickness of the substrate does not become less than 200 µm. The surface of the substrate is preferably mirror-polished so that the thickness of the substrate does not become less than 200 µm. All of the first layer may be removed after the completion of the crystal growth.

In the production method of the III-V nitride semiconductor substrate of the present invention, recesses in the roughness formed on the crystal growth interface at the initial or intermediate stage of the crystal growth are preferably (1) in a V-shaped or inversed-trapezoidal shape in a cross section in parallel to the crystal growth direction, which is surrounded by facet planes, or (2) in a conical shape surrounded by facet planes.

In the production method of the III-V nitride semiconductor substrate of the present invention, at least part of the crystal growth is carried out by an HVPE method.

In the production method of the III-V nitride semiconductor substrate of the present invention, it is preferable that to bury the roughness of the crystal growth interface during the crystal growth, a hydrogen concentration in a growth atmosphere gas or the partial pressure of a group-III source is made higher than in the previous steps.

In the production method according to the ninth or tenth embodiments, both top and bottom surfaces of the substrate cut out from the thick-grown crystal (second layer) are polished.

In a lot composed of a plurality of III-V nitride semiconductor substrates according to the present invention, all of the substrates are the above III-V nitride semiconductor substrates.

BRIEF DESCRIPTION OF THE DRAWINGS

FIG. 3 is a fluorescent photomicrograph showing a cross section of the self-supported GaN substrate of the present invention (Example 1);

DETAILED DESCRIPTION OF THE PREFERRED EMBODIMENTS

Figure 1:
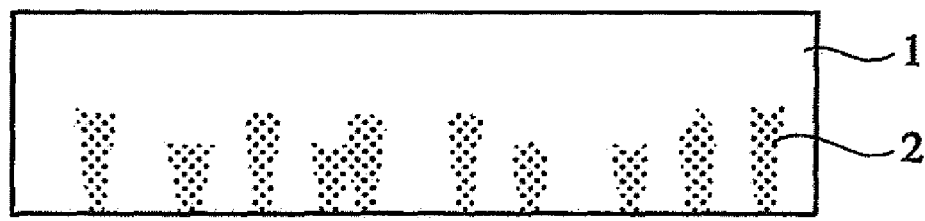
FIG. 1 is a schematic cross-sectional view showing the structure of the self-supported GaN substrate of the present invention (Example 1)

The term "self-supported substrate" used herein means a substrate having such strength that is not only enough to maintain its shape but also suitable for handling. To have such strength, the self-supported substrate preferably has a thickness of 200 μm or more. To make the cleavage easy after the formation of devices, the self-supported substrate preferably has a thickness of 1 mm or less. When the self-supported substrate is too thick, the cleavage is difficult, resulting in a rough cleavage surface. If the self-supported substrate with a rough cleavage surface were used to produce semiconductor lasers, etc., they would have deteriorated characteristics due to reflection loss.

The III-V nitride semiconductors, to which the present invention is applicable, can be represented by the general formula: $In_xGa_yAl_{1-x-y}N$, wherein $0 \leq x \leq 1$, $0 \leq y \leq 1$, and $0 \leq x+y \leq 1$. Among others, semiconductors such as GaN, AlGaN, etc. are particularly preferable because they satisfy the demand of substrate materials, such as strength, production stability, etc.

Though regions having different carrier concentrations are not distinguishable on the crystal surface by the naked eye, they are easily detected by photoluminescence of the crystal caused by the irradiation of ultraviolet rays. In a crystal grown in the c-axis direction of a hexagonal crystal system, pits surrounded by facet planes are in a hexagonal or dodecagonal shape when viewed from the c-axis direction. Accordingly, its growth hysteresis is a hexagonal or dodecagonal prism. However, because each pit is small in the initial stage of the crystal growth, the growth hysteresis is generally a hexagonal or dodecagonal pyramid expanding as nearing the top surface of the substrate. When the regions surrounded by the facets are not pits but stripes grown through a mask by ELO such as FIELO, their hysteresis is a wedge or plate shape or a shape resembled thereto, which is an inversed triangle or trapezoid in a cross section perpendicular to the stripe direction.

Because the regions having different carrier concentrations have clear boundaries with their surroundings, a fluorescence microscope can easily detect them by image contrast. Though the detectable depth varies depending on the wavelength and strength of ultraviolet rays as excitation light, whether a detected image is seen on a sample surface or not is easily determined from an image-focusing position. The detection of the regions having different carrier concentrations may also be carried out easily by usual scanning electron microscopy (SEM) and cathodeluminescence (CL).

Each region having different carrier concentration in the III-V nitride semiconductor substrate of the present invention preferably has a width of 1 mm or less, because devices such as laser diodes and light-emitting diodes produced by using such substrates have chip sizes of 1 mm or less. When the regions having different carrier concentrations are thicker than 1 mm, chips formed on the entire surface of the substrate are highly likely to be included in the regions having different carrier concentrations, resulting in drastic decrease in the yield of devices. Of course, even when the regions having different carrier concentrations are thicker than 1 mm, it is preferable that the surface carrier concentration is highly uniform to avoid the effectiveness of the present invention from being hindered.

The substrate of the present invention desirably has a (0001) plane of the group III element on the surface. Because the GaN crystal has strong polarity, and because its group III surface is more stable than its group V surface (nitrogen surface) chemically and thermally, the production of devices is easier on the group III surface than on the group V surface.

The substrate of the present invention having decreased dislocations propagating to its surface during crystal growth and a uniform carrier concentration is characterized by a dislocation density that is lower on a top surface than on a bottom surface. For instance, with respect to the dislocation density measured by an etch-pit method, etc., the top surface of the substrate is desirably ½ or less of the bottom surface.

The growth of the III-V nitride semiconductor substrate of the present invention is preferably carried out by a hydride vapor-phase epitaxy (HVPE) method, because the HVPE method is advantageous in a high crystal growth rate, suitable for the production of substrates.

Because the absolute value of the carrier concentration of the III-V nitride semiconductor substrate should properly be controlled depending on devices to be produced, it cannot be determined without taking the types of devices, etc. into consideration. Because variations in the carrier concentration should be changeable according to the absolute value of the carrier concentration, it cannot also be determined without taking into consideration the absolute value of the carrier concentration. For instance, when an Si-doped, n-type GaN substrate to be produced has a carrier concentration of about $1 \times 10^{17}$ cm$^{-3}$, variations in the carrier concentration on the top surface of the substrate are preferably within ±25%. When the carrier concentration is about $5 \times 10^{17}$ cm$^{-3}$, variations in the carrier concentration on the top surface of the substrate are preferably within ±15%. When the carrier concentration is about $5 \times 10^{18}$ cm$^{-3}$, variations in the carrier concentration on the top surface of the substrate are preferably within ±10%. Incidentally, when an Si-doped, n-type GaN substrate to be produced has a carrier concentration of less than $1 \times 10^{17}$ cm$^{-3}$, variations in the carrier concentration on the top surface of the substrate are preferably within ±100%. As described above, a preferable range of variations in the carrier concentration depends on the carrier concentration of the substrate, because the lower the carrier concentration in the substrate is, the less influence is caused by its large variations.

The type of conductivity of the substrate of the present invention may properly be selected depending on devices to be produced thereon. Examples of the conductivity type of the substrate of the present invention include an n-type doped with Si, S, O, etc.; a p-type doped with Mg, Zn, etc.; and semi-insulating-type doped with Fe, Cr, etc. or with an n-type dopant and a p-type dopant simultaneously.

The surface of the III-V nitride semiconductor substrate (for instance, GaN substrate) of the present invention is preferably mirror-polished. The surface of the as-grown epitaxial GaN layer generally has a lot of large-scale roughness such as hillocks, etc., and a lot of small-scale roughness that is considered to be formed by step bunching. Such rough surface causes not only nonuniformity in morphology, film thickness, composition, etc. when an epitaxial layer is grown on the top surface of the substrate, but also low light exposure accuracy in a photolithography process in the production of devices. Accordingly, the substrate desirably has a flat mirror surface. To obtain a mirror surface by polishing, the crystal surface should be scraped off to a depth of several to several hundreds of microns. In the present invention, the surface layer having a substantially uniform carrier concentration should be as thick as 10 µm or more even after polishing. Therefore, in a case where the top surface of the substrate is to be polished, the surface layer having a uniform carrier concentration should be grown in the crystal growth process to such a thickness that takes into account a margin of polishing.

It is also desirable that the bottom surface of the III-V nitride semiconductor substrate of the present invention is polished flat. The self-supported substrate of the III-V nitride semiconductor (GaN, etc.) is usually obtained by heteroepitaxial growth on a different base substrate and peeling. Accordingly, it is likely that the as-peeled substrate has a rough bottom surface like a frosted glass, with part of the base substrate stuck thereto. In addition, some self-supported substrates are not flat because of the warping of the substrates themselves. These factors cause a nonuniform temperature distribution in the substrate when an epitaxial layer is grown on the substrate, resulting in decrease in the uniformity of the epitaxial layer and the deterioration of reproducibility.

When it is said that surface layer exists from a mirror-polished surface to a depth of at least 10 µm, it means that the surface layer has a depth of at least 10 µm after mirror-polished. Accordingly, the depth of this surface layer before mirror-polishing should be at least 10 µm+a thickness removed off by mirror-polishing. The words "carrier concentration distribution is substantially uniform" do not mean that the carrier concentration distribution is completely constant throughout the substrate, but mean that unevenness in the carrier concentration is small enough to form devices with constant characteristics on the substrate. Therefore, in the case of the Si-doped, n-type GaN substrate (carrier concentration: about $5 \times 10^{17}$ cm$^{-1}$), they mean that unevenness in the carrier concentration is within ±15%.

In the production method of the III-V nitride semiconductor substrate of the present invention, both top and bottom surfaces of the substrate cut out from the thick-grown crystal are preferably polished. Because the cut surface of the crystal generally has such roughness as saw marks, etc., it is difficult to achieve good epitaxial growth without working. The cutting of the crystal can be carried out by a slicer with a peripheral cutting edge, a slicer with an internal cutting edge, a wire saw, etc. Among them, the wire-saw is preferably used.

Though the present invention is applied to the self-supported substrates of the III-V nitride semiconductors (GaN, etc.), the concept of the present invention is also applicable to epitaxial GaN substrates (templates), from which base substrates are not removed.

The present invention will be described in detail referring to Examples below without intention of limiting the present invention thereto.

EXAMPLE 1

Figure 2:
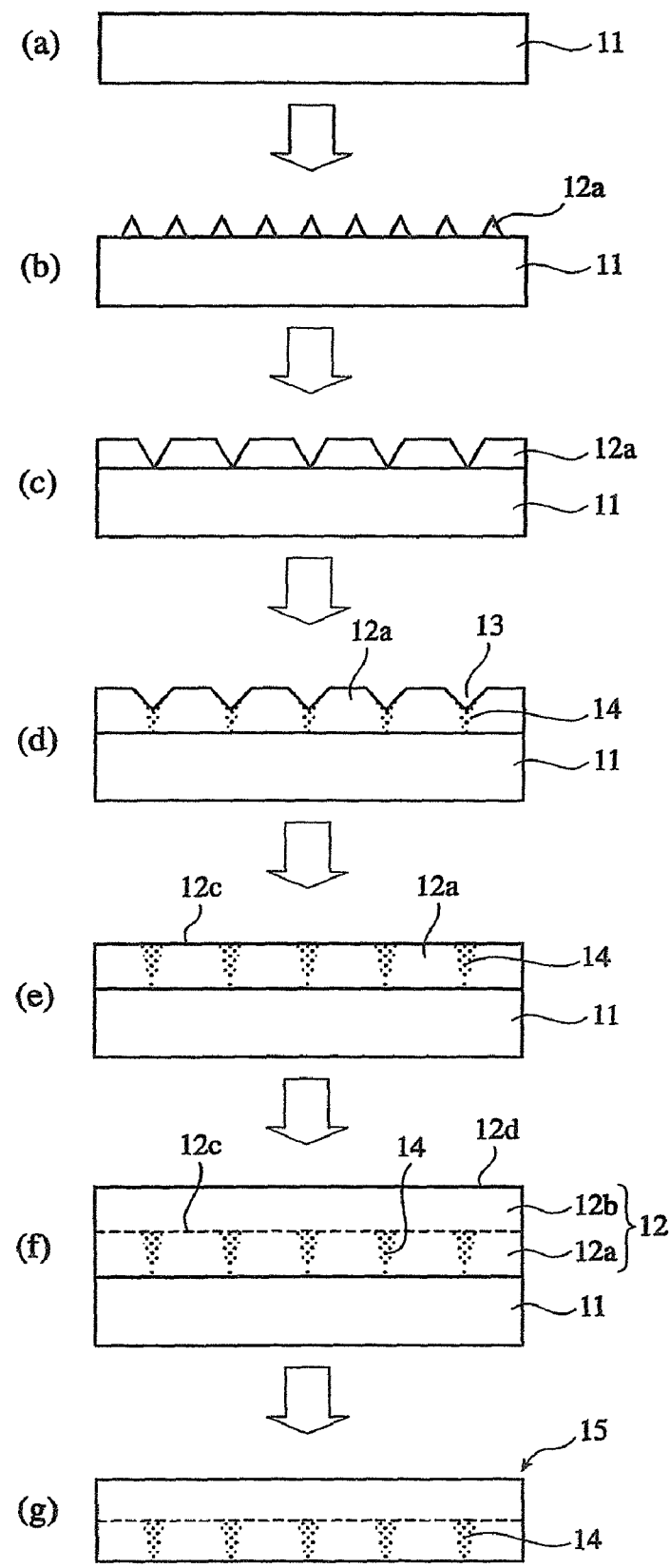
FIG. 2 is a schematic view showing one example of the production process of the self-supported GaN substrate of the present invention (Examples 1 and 2)

An epitaxial GaN layer was grown on a sapphire substrate, and the sapphire substrate was then removed to produce and evaluate a self-supported GaN substrate 1 having a layer containing regions 2 having different carrier concentrations and a layer having a substantially uniform carrier concentration as shown in FIG. 1. The production method of the self-supported GaN substrate in this Example will be explained below referring to FIG. 2.

First, an epitaxial GaN layer 12a was grown on a sapphire substrate 11 by an HVPE method. The HVPE method is a method, in which GaCl, a halide of a group-III element, is transported onto a surface of a heated base substrate, and mixed with $NH_3$ on the base substrate, so that they react with each other to cause the vapor-phase growth of a GaN crystal on the base substrate 11. The source gases are supplied with carrier gases such as $H_2$ and $N_2$. The temperature in a region surrounding the base substrate 11 was set at 1000° C. by an electric furnace. The resultant GaN crystal was doped with Si by supplying $SiH_2Cl_2$ as a doping gas to the substrate in the growing process of the GaN crystal.

The partial pressures of GaCl and $NH_3$ as sources were $5 \times 10^{-3}$ atm and 0.3 atm, respectively, in a space surrounding the substrate. A mixed gas of 2% of $H_2$ and 98% of $N_2$ was used as a carrier gas. Under these conditions, nuclei of the GaN crystal 12a were generated on the sapphire substrate 11 in a three-dimensional island growth mode. With facet planes appeared on sidewalls of each crystal nucleus, crystal growth progressed [step (b)]. This was confirmed by microscopic observation on the surface and cross section of a substrate taken out of the furnace every growing time.

As the growing time became longer, the top portions of the GaN crystals 12a became flat [step (c)], and the GaN crystals 12a continued growing in lateral directions to coalesce with each other so that their top surfaces became further flat. However, because the growth interface did not become completely flat, crystal growth progressed in a state where the substrate had many pits 13 on the surface [step (d)]. Each pit 13 was substantially in a circular shape having a diameter of about several to several tens of microns when viewed from right above. Observed in a fluorescence photomicrograph showing the cross section of a sample at the step (d) were dark regions 14 extending from an interface with the sapphire substrate 11 to the pits 13 exiting on the GaN surface. It is presumed that these regions 14 contained a small amount of the dopant, with a lower carrier concentration than the surroundings. In fact, the comparison of the SIMS analysis results of the dark regions 14 with those of the neighbor regions in a fluorescent photomicrograph revealed that the concentration of Si was $3 \times 10^{17}$ cm$^{-3}$ in the dark regions 14, while it was $7 \times 10^{17}$ cm$^{-3}$, twice or more, in the neighbor regions.

After growing the GaN crystal 12a to the state (d), the growth of the GaN crystal 12a was continued with the carrier gas changed to a mixed gas of 10% $H_2$ and 90% $N_2$, without changing the flow rate of the source gas.

As a result, it was observed that the growth interface 12c of the GaN crystal 12a tended to become flat [step (e)]. After the growth interface of the GaN crystal 12a became flat, a GaN crystal 12b was grown to a thickness of 100 µm or more. The fluorescent microscopic observation of a cross section of the region 12b grown after flattening of the growth interface revealed that no different-brightness regions were newly generated. That is, it was confirmed that the different-brightness regions 14 were terminated in the middle of the GaN crystal 12 (growth interface 12c) [step (f)], and did not reach the outermost surface 12d of the GaN crystal 12. FIG. 3 shows a fluorescent photomicrograph taken on the GaN crystal 12. Though part of pits did not terminate but reached the top surface, most pits were terminated in the middle of the GaN crystal 12. It was confirmed that brightness in a range up to a depth of at least 10 μm from the crystal surface was substantially uniform in the fluorescent photomicrograph.

The GaN crystal 12 having a total thickness of 250 μm was thus grown on the sapphire substrate 11. The average growth rate of the GaN crystal 12 was about 50 μm/h.

A hetero-epitaxial substrate thus formed, which had the sapphire substrate 11 and the epitaxial GaN layer 12 thereon, was taken out of a reaction tube, and the sapphire substrate 11 was removed from the hetero-epitaxial substrate to obtain a self-supported GaN substrate 15. The removal of the sapphire substrate 11 was conducted by a so-called laser lift-off method comprising irradiating the hetero-epitaxial substrate with high-power ultraviolet laser beams having such a wavelength that can transmit the sapphire substrate 11 but is absorbed by GaN, from the side of the sapphire substrate 11 to melt an interface with the GaN crystal 12, thereby separating the GaN crystal 12. In addition, the sapphire substrate 11 can be removed, for instance, by mechanical polishing, or etching with a strong alkali or acid agent. Further, physical etching with ion or electron beams or neutron beams may be carried out for the removal of the sapphire substrate 11.

After removing a top surface portion and a bottom surface portion both in a thickness of 10 μm from the self-supported GaN substrate 15 thus obtained, the self-supported GaN substrate 15 was mirror-polished to improve its flatness. The self-supported GaN substrate 15 had a final thickness of 230 μm, with sufficient strength to withstand handling with tweezers. The fluorescent microscopic observation of a cross section of the self-supported GaN substrate 15 revealed that there were substantially no regions with different carrier concentrations in a surface portion (to a depth of at least 10 μm) of the self-supported GaN substrate 15.

Figure 4:
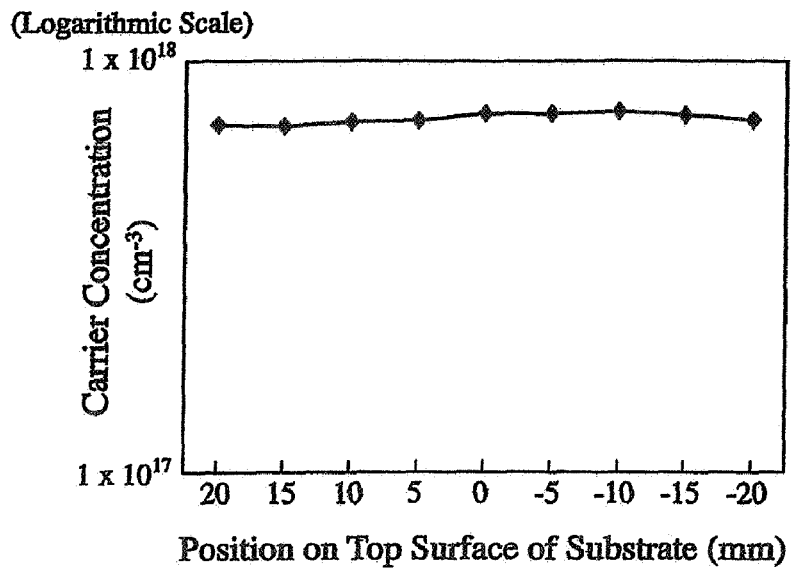
FIG. 4 is a graph showing a carrier concentration distribution on a top surface of the self-supported GaN substrate of the present invention (Example 1)
Figure 5:
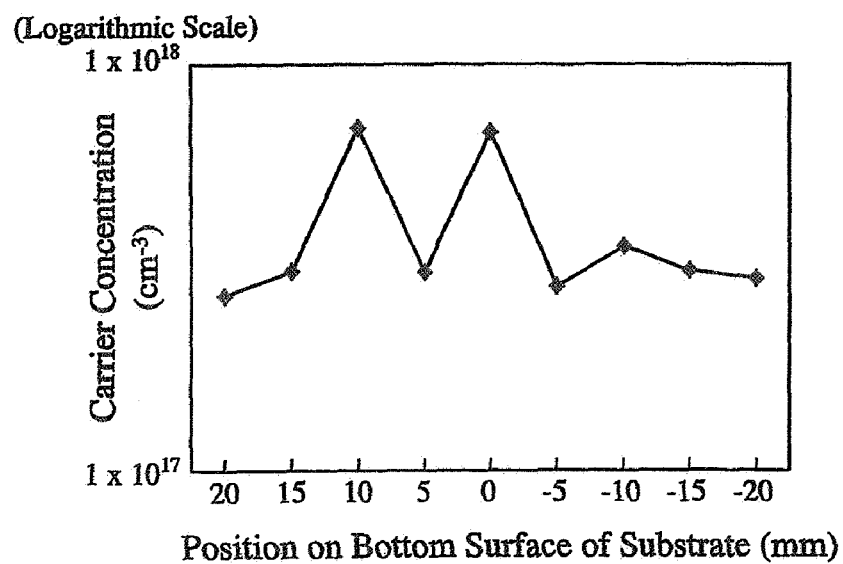
FIG. 5 is a graph showing a carrier concentration distribution on a bottom surface of the self-supported GaN substrate of the present invention (Example 1)

The carrier concentration distributions on top and bottom surfaces of this self-supported GaN substrate 15 were measured by a van der Pauw method at an interval of 5 mm in a diameter direction of the substrate. The results are shown in FIGS. 4 and 5. It was confirmed from FIG. 4 that the carrier concentration on the top surface of the self-supported GaN substrate 15 was as sufficiently uniform as $6.9 \times 10^{17}$ cm$^{-3}$ to $7.6 \times 10^{17}$ cm$^{-3}$. On the contrary, it was found from FIG. 5 that the carrier concentration on the bottom surface of the self-supported GaN substrate 15 were extremely nonuniform, from $2.7 \times 10^{17}$ cm$^{-3}$ to $7.1 \times 10^{17}$ cm$^{-3}$.

An epitaxial GaN film was grown to a thickness of 1 μm on this self-supported GaN substrate 15 by an MOVPE method, and its surface morphology was examined. As a result, it was confirmed that the entire top surface of the epitaxial GaN film was a uniform mirror surface.

Comparative Example 1

A thick GaN crystal layer was grown on a sapphire substrate in the same manner as in Example 1 except that the partial pressures of GaCl and NH$_3$ as source gases was $5 \times 10^{-3}$ atm and 0.3 atm, respectively, on the substrate, and that a carrier gas used was a mixed gas of 2% H$_2$ and 98% N$_2$. As a result, many pits remained unburied on the surface until GaN became as thick as 300 μm.

This substrate was taken out of the reaction tube, and the sapphire substrate was removed by the above laser lift-off method to obtain a self-supported GaN substrate. Both top and bottom surfaces of the self-supported GaN substrate were mirror-polished to depths of 30 μm and 10 μm, respectively, to improve the flatness of the substrate. By mirror-polishing, almost all pits remaining on the surface of the substrate disappeared. The final thickness of the self-supported GaN substrate was 260 μm.

Figure 6:
FIG. 6 is a fluorescent photomicrograph showing the cross section of a conventional self-supported GaN substrate (Comparative Example 1)

The cross section of the self-supported GaN substrate was observed by a fluorescence microscope. As shown in FIG. 6, many wedge-shaped regions extending between a top surface and a bottom surface and having different brightness from the surroundings existed in the substrate.

The carrier concentration distributions on the top and bottom surfaces of this self-supported GaN substrate were measured by a van der Pauw method at an interval of 5 mm in a diameter direction of the substrate. As a result, it was found that the carrier concentration on the top surface of the substrate was as largely uneven as $2.4 \times 10^{17}$ cm$^{-3}$ to $7.7 \times 10^{17}$ cm$^{-3}$, not so different from a nonuniform carrier concentration on the bottom surface ($2.6 \times 10^{17}$ cm$^{-3}$ to $8.1 \times 10^{17}$ cm$^{-3}$).

A 1-μm-thick epitaxial GaN film was grown on this self-supported GaN substrate by the MOVPE method. The observation of its surface morphology confirmed that many terrace-shaped projections of about 10 to 60 μm in diameter were formed on the entire surface of the epitaxial GaN film. These projections appear to be obstacles in the practical production of devices.

EXAMPLE 2

An epitaxial GaN layer was grown on a sapphire substrate substantially in the same manner as in Example 1 except for slight changes in crystal growth conditions in the HVPE method, and the sapphire substrate was removed to produce and evaluate a self-supported GaN substrate shown in FIG. 1. The production method of the self-supported GaN substrate in this Example will be explained below referring to FIG. 2.

First, an epitaxial GaN layer 12a was grown by the same HVPE method as in Example 1 using a C-plane sapphire substrate 11. The temperature on the substrate was set at 1050° C. by an electric furnace. The partial pressures of GaCl and NH$_3$ as source gases were $6 \times 10^{-3}$ atm and 0.4 atm, respectively, on the substrate, and the carrier gas used was a mixed gas of 10% H$_2$ and 90% N$_2$ from the initial stage. The GaN crystal was doped with Si by supplying SiH$_2$Cl$_2$ as a doping gas onto the substrate in the process of growing the GaN crystal.

First, nuclei of the GaN crystal 12a were formed on the sapphire substrate 11 in a three-dimensional island mode, and facet planes then appeared on the sidewalls of the crystal nuclei 12a, progressing crystal growth [step (b)]. This was confirmed by the microscopic observation of the surface and cross section of the substrate taken out of a furnace after different growth time periods. As the growing time went, the top portion of the GaN crystal 12a became flat with a (0001) Ga plane above, and crystals growing in lateral directions then coalesced with each other, resulting in further flattening of the surface [step (c)]. As a result of further crystal growth under the same conditions, pits 13 on the growth interface 12c of the GaN crystal 12a were spontaneously terminated, so that the substrate 12a tended to become flat [step (e)]. Thus, after the growth interface 12c of the GaN crystal 12a became flat, a GaN crystal 12b was grown to a thickness of 100 μm or more.

In the layer 12b grown after the growth interface spontaneously became flat, it was confirmed from the fluorescent microscopic observation of its cross section that no different-brightness regions were newly generated. Thus, the regions 14 having different brightness ended halfway without reaching the outermost surface 12d of the GaN crystal 12 [step (f)].

Thus, the GaN crystal 12 was grown in a total thickness of 550 μm on the sapphire substrate 11. The average growth speed of the GaN crystal 12 was about 65 μm/h.

This substrate was taken out of the reaction tube, and the sapphire substrate 11 was removed by the above-described laser lift-off method to obtain a self-supported GaN substrate 15. Both top and bottom surfaces of the self-supported GaN substrate 15 was mirror-polished to remove a top surface portion of 30 μm and a bottom surface of 90 μm, respectively, to improve its flatness. The final thickness of the self-supported GaN substrate was 430 μm by mirror-polishing.

The carrier concentration distribution of this self-supported GaN substrate 15 on top and bottom surfaces was measured at an interval of 5 mm in a diameter direction of the substrate by the van der Pauw method. As a result, it was confirmed that the carrier concentration on the top surface of the substrate was sufficiently uniform in a range of $0.9 \times 10^{18}$ $cm^{-3}$ to $1.6 \times 10^{18}$ $cm^{-3}$. On the other hand, the carrier concentration on the bottom surface of the substrate was largely varying from $4.7 \times 10^{17}$ $cm^{-3}$ to $13.1 \times 10^{17}$ $cm^{-3}$.

The fluorescent microscopic observation of the cross section of the resultant self-supported GaN substrate 15 revealed that there were no different-brightness regions up to a depth of 100 μm or more from the top surface of the substrate.

EXAMPLE 3

Figure 7:
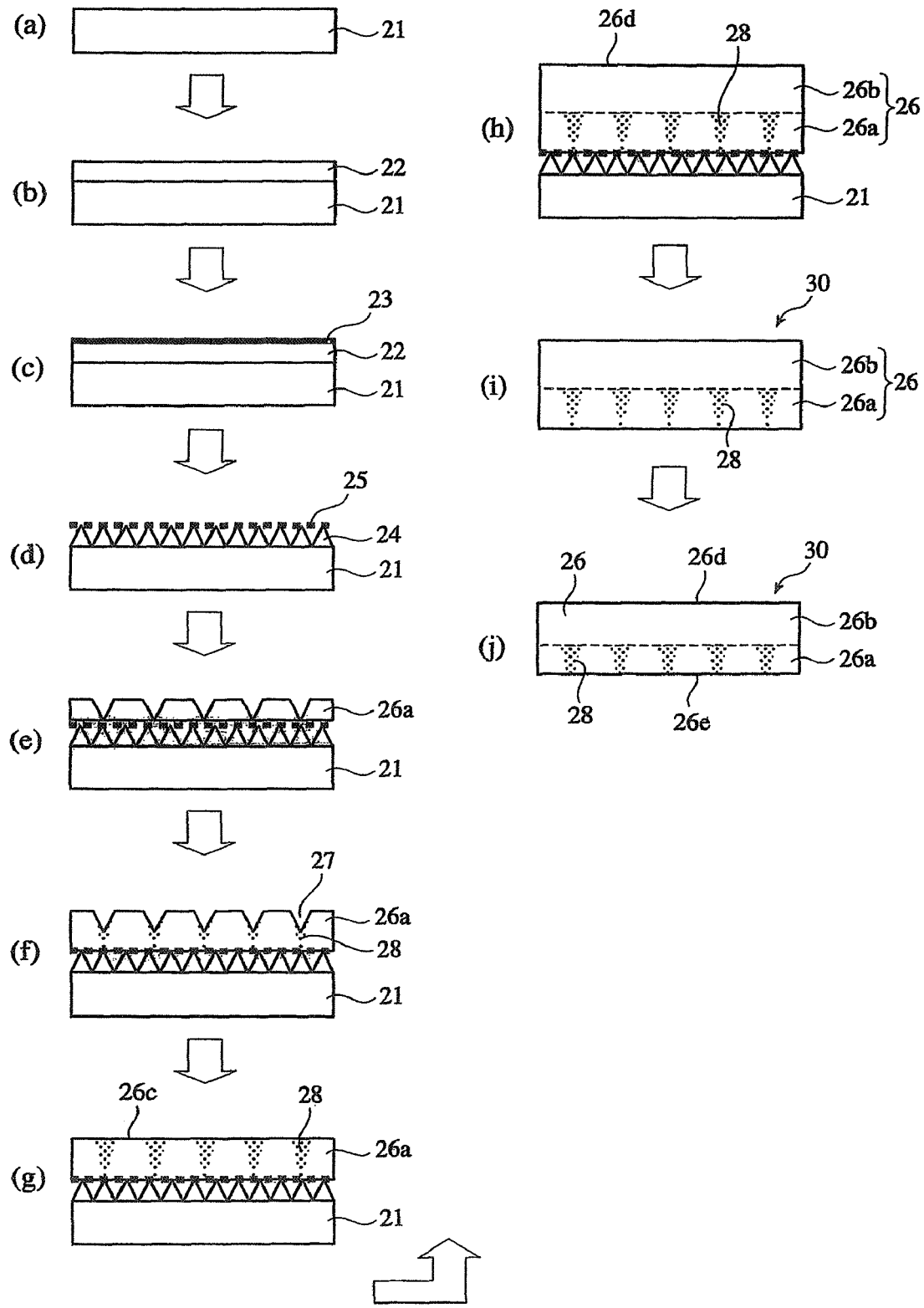
FIG. 7 is a schematic view showing one example of the production process of the self-supported GaN substrate of the present invention (Example 3)

An epitaxial GaN layer was grown on a sapphire substrate by a void-assisted separation (VAS) method, and the sapphire substrate was then removed to produce and evaluate a self-supported GaN substrate. The details of the VAS method are described in JP 2003-178984 A. Briefly, it is a method in which crystal growth is carried out with a thin film of titanium nitride having a network structure formed between the sapphire substrate and a growing GaN layer. A method for producing a self-supported GaN substrate in this Example will be described below referring to FIG. 7.

An undoped GaN layer 22 was grown to a thickness of 300 nM on a 2-inch-diameter, C-plane substrate 21 of a single crystal sapphire, with trimethylgallium (TMG) and $NH_3$ as source gases by an MOVPE method [step (b)]. A metal Ti film 23 was then vapor-deposited to a thickness of 20 nm on this epitaxial GaN substrate 22 [step (c)], and the substrate was subjected to a heat treatment at 1050° C. for 20 minutes in a stream of a mixed gas of 20% $NH_3$ and 80% $H_2$ in an electric furnace. As a result, the GaN layer 22 was changed by partial etching to a layer 24 having voids generated at a high density, and the metal Ti film 23 was changed by nitriding to a TiN layer 25 having fine holes on the submicron order generated at a high density. As a result, a substrate having a structure shown in (d) was obtained.

This substrate was placed in an HVPE furnace to deposit a GaN crystal 26 to a total thickness of 400 μm. Source gases used for the growth of the GaN crystal 26a were $NH_3$ and GaCl, and a carrier gas used was a mixed gas of 5% $H_2$ and 95% $N_2$. The growth conditions were normal pressure and a substrate temperature of 1040° C. The partial pressures of GaCl and $NH_3$ in the gas supplied were $8 \times 10^{-3}$ atm and $5.6 \times 1$ atm, respectively, to provide a V/III ratio of 7 at an initial stage of growth. Also, $SiH_2Cl_2$ as a doping gas was supplied onto the substrate, so that a GaN crystal 26a was doped with Si in its growth process.

Nuclei of GaN crystals 26a were first grown on the substrate 21 in a three-dimensional island mode [step (e)], and the crystals growing in lateral directions then coalesed with each other so that their surfaces became flat [step (f)]. This was confirmed by the microscopic observation of the surface and cross section of the substrate taken out of the furnace after different growth time periods. As the growth time passed, the number of pits 27 in the growth interface of the GaN crystal 26a decreased, though crystal growth progressed in such a manner that the pits 27 did not completely disappear with many pits remaining on the surface. Each pit 27 was in a circular or dodecagonal shape having a diameter of about several to several tens of microns when viewed from right above. In a fluorescent photomicrograph of a cross section of a sample corresponding to the step (f), there were dark regions 28 extending from an interface with the substrate 21 to the bottoms of the pits 27 existing on the GaN surface. It is presumed that these regions 28 contained a small amount of the dopant, with a lower carrier concentration than the surroundings.

After GaN crystal 26a was grown to a state shown in (f), crystal growth was continued with the partial pressure of GaCl in the supplied gas increased to $12 \times 10^{-2}$ atm. As a result, the pits 27 were terminated, and the growth interface of the GaN crystal 26a tended to become further flat [step (g)]. After the growth interface 26c of the GaN crystal 26a became flat, the growth of the GaN crystal 26b was further continued to a thickness of 200 μm or more. In a layer 26b grown after the flattening of the growth interface, that fluorescent microscopic observation of its cross section revealed that no different-brightness regions were newly generated. It was thus confirmed that the different-brightness regions 28 were terminated in the middle of the GaN crystal 26 [step (h)], without reaching the outermost surface 26d of the GaN crystal.

After the growth of the GaN crystal 26 was completed, the GaN layer 26 spontaneously peeled off from the sapphire base substrate 21 with a void layer as a parting interface in the course of cooling the HVPE apparatus, to obtain a self-supported GaN substrate 30 [step (i)]. This self-supported GaN substrate 30 was mirror-polished on both top and bottom surfaces to remove a top surface portion to a depth of 20 μm and a bottom surface portion to a depth of 50 μm, thereby improving the flatness of the substrate 30. By mirror-polishing, the final thickness of the self-supported GaN substrate 30 became 330 μm [step (j)].

The carrier concentration distribution of the resultant self-supported GaN substrate 30 was measured by a van der Pauw method at an interval of 5 mm in a diameter direction of the substrate on top and bottom surfaces. As a result, it was confirmed that the carrier concentration on the top surface 26d of the substrate was sufficiently uniform in a range of $9.2 \times 10^{17}$ to $10.1 \times 10^{17}$ $cm^{-3}$. On the contrary, the carrier concentration on the bottom surface 26e of the substrate was largely varying from $2.8 \times 10^{17}$ $cm^{-3}$ to $8.8 \times 10^{17}$ $cm^{-3}$. The fluorescent microscopic observation of the cross section of this self-supported GaN substrate 30 revealed that no different-brightness regions 28 existed up to a depth of 100 μm or more from the top surface 26d.

The dislocation density of the self-supported GaN substrate 30 was measured on their top and bottom surfaces 26d, 26e. The dislocation density on the top surface 26d was determined by immersing the self-supported GaN substrate 30 in a heated mixture of phosphoric acid and sulfuric acid, and counting the number of pits generated by etching. The dislocation density on the bottom surface 26e was determined from a plan-view TEM image. As a result, it was found that this self-supported GaN substrate 30 had a dislocation density of $4.2 \pm 1 \times 10^6$ $cm^{-2}$ on the top surface 26d, and a dislocation density of $7.2 \pm 1 \times 10^8$ $cm^{-2}$ on the bottom surface 26e.

EXAMPLE 4

Figure 8:
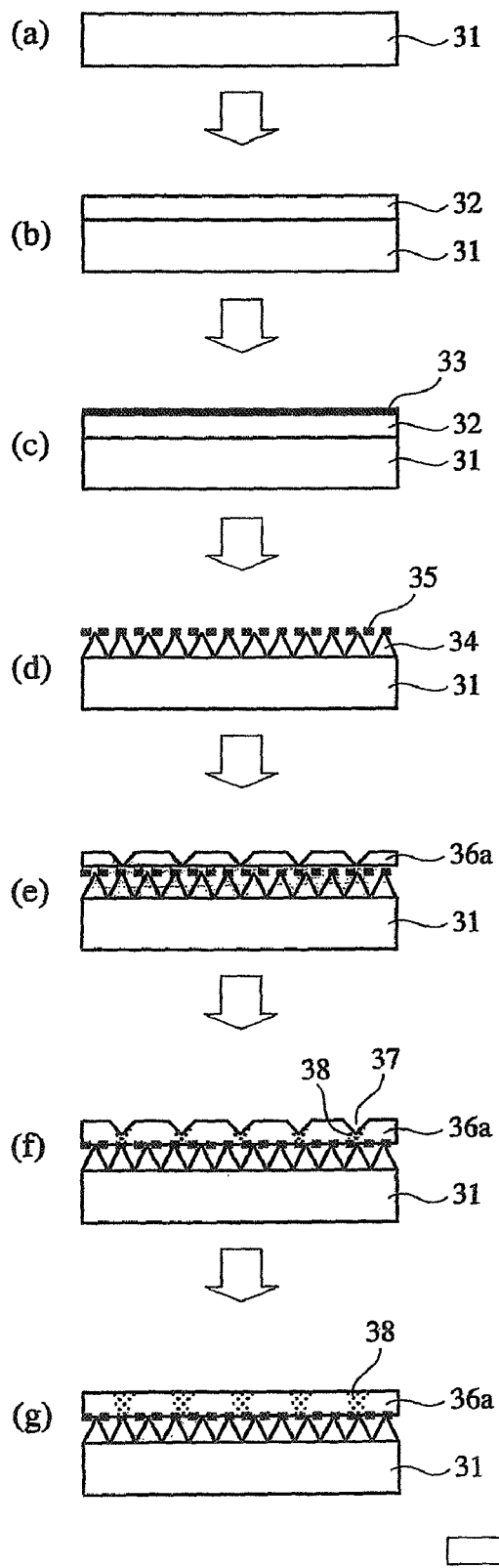
FIG. 8 is a schematic view showing another example of the production process of the self-supported GaN substrate of the present invention (Example 4)
Figure 8:
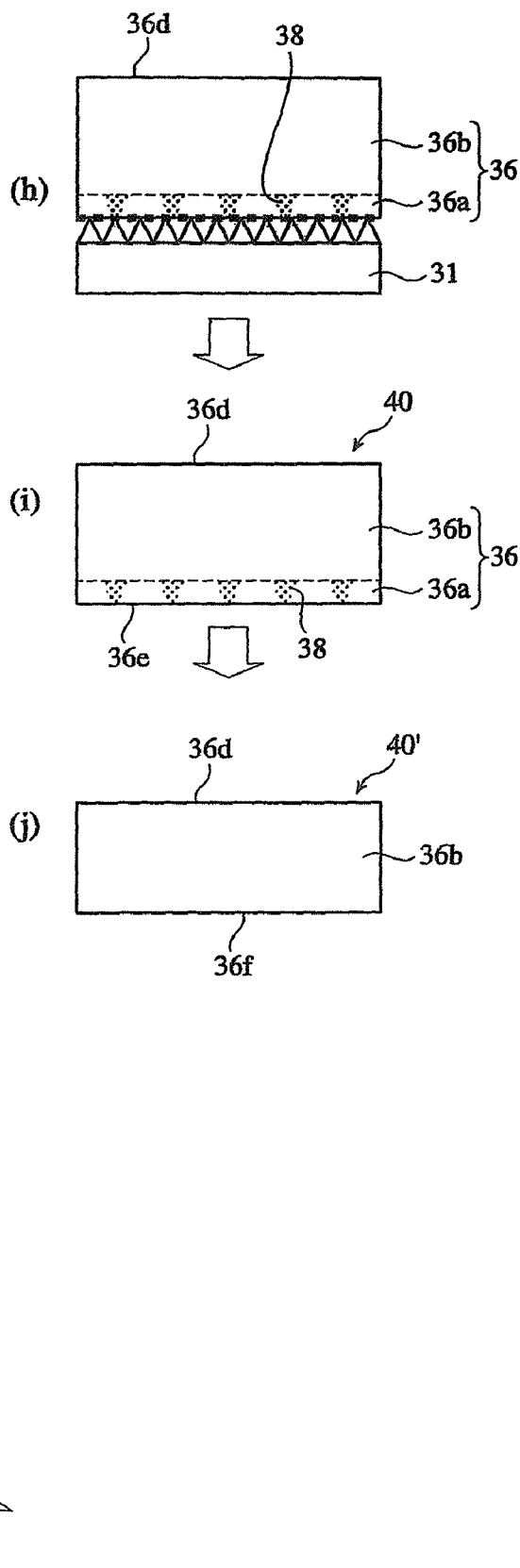

A self-supported GaN substrate was produced by growing an epitaxial GaN layer on a sapphire substrate by a VAS method and then removing the sapphire substrate in the same manner as in Example 3, and evaluated. The production method of the self-supported GaN substrate in this Example will be explained below referring to FIG. 8.

An undoped GaN layer 32 was grown to a thickness of 300 nm on a 2-inch-diameter, C-plane substrate 31 of single crystal sapphire by an MOVPE method with TMG and $NH_3$ as source gases [step (b)]. A Ti metal film 33 was vapor-deposited to a thickness of 20 nm on this Epitaxial GaN substrate 32 [step (c)], and the substrate was subjected to a heat treatment at 1050° C. for 20 minutes in a stream of a mixed gas of 20% $NH_3$ and 80% $H_2$ in an electric furnace. As a result, the GaN layer 32 was changed by partial etching to a layer 34 having voids generated at a high density, and the Ti layer 33 was changed by nitriding to a TiN layer 35 having fine holes of submicrons at a high density, thereby providing a substrate having a structure shown in (d).

This substrate was placed in an HVPE furnace, and a GaN crystal 36 was grown to a thickness of 550 μm. Source gases used for the crystal growth were $NH_3$ and GaCl, and a carrier gas used was a mixed gas of 5% $H_2$ and 95% $N_2$. The growth conditions were a normal pressure and a substrate temperature of 1040° C. The partial pressures of GaCl and $NH_3$ in the gas supplied were $8\times10^{-3}$ atm and $5.6\times10^{-2}$ atm, respectively, to provide a V/III ratio of 7 at the time of starting crystal growth. Also, $SiH_2Cl_2$ as a doping gas was supplied onto the substrate during the growth of the GaN crystal 36a, so that the GaN crystal 36a was doped with Si.

First, nuclei of GaN 36a were generated in a three-dimensional island mode on the substrate 31 [step (e)], and the crystals 36a growing in lateral directions coalesced with each other, so that the GaN surfaces became flat [step (f)]. This was confirmed by the microscopic observation of the surface and cross section of the substrate taken out of the furnace after different growth time periods. As the growth time passed, the number of pits 37 on the growth interface of the GaN crystal 36a decreased. However, crystal growth progressed in a state in which pits 37 did not completely disappear and many pits remained on the surface. Each pit 37 was in a substantially circular or dodecagonal shape having a diameter of about several to several tens of microns when viewed from right above. In a fluorescent photomicrograph of the cross section of a sample corresponding to the step (f), dark regions 38 extending from the substrate interface to the bottoms of the pits 37 existing on the GaN surface were observed. It is presumed that these regions 38 contained a small amount of the dopant, with a lower carrier concentration than the surroundings.

After the GaN crystal 36a was grown to a state shown in (f), crystal growth was continued with the partial pressure of GaCl in the supplied gas increased to $12\times10^{-2}$ atm, so that the pits 37 were terminated, and that the growth interface of the GaN crystal 36a tended to become flat [step (g)]. Until this point, the GaN crystal 36a was grown to a thickness of approximately 80 μm. After the growth interface of the GaN crystal 36a became flat, the growth of GaN crystal 36b was further continued to a thickness of 470 μm. In the layer 36b grown after the growth interface became flat, the fluorescent microscopic observation of its cross section indicated that no different-brightness regions were newly generated. Namely, it was confirmed that the different-brightness regions 38 were terminated in the middle of the GaN crystal 36 [step (h)], without reaching the outermost surface of the crystal.

During cooling the HVPE apparatus after the completion of crystal growth, the GaN layer 36 spontaneously peeled off from the base substrate 31 with a void layer as a parting interface, to obtain a self-supported GaN substrate 40, [step (i)]. This self-supported GaN substrate 40 was mirror-polished on both top and bottom surfaces 36d, 36e, to remove top and bottom surface portions to depths of 20 μm and 100 μm, respectively, thereby improving the flatness of the substrate 40 [step (j)]. By mirror-polishing, the final thickness of the self-supported GaN substrate 40' became 430 μm.

The carrier concentration distribution of the resultant self-supported GaN substrate 40' was measured on top and bottom surfaces 36d, 36f at an interval of 5 mm in a diameter direction of the substrate 40' by a van der Pauw method. As a result, it was found that the carrier concentration on the top surface 36d of the substrate 40' was sufficiently uniform in a range of $9.2\times10^{17}$ cm$^{-3}$ to $10.1\times10^{17}$ cm$^{-3}$. It was also found that the carrier concentration on the bottom surface 36f of the substrate 40' was $8.8\times10^{17}$ cm$^{-3}$ to $10.8\times10^{17}$ cm$^{-3}$, not largely different from that on the top surface 36d. The fluorescent microscopic observation of the cross section of this self-supported GaN substrate 40' revealed that there were no different-brightness regions inside the substrate 40'.

EXAMPLE 5

Figure 9:
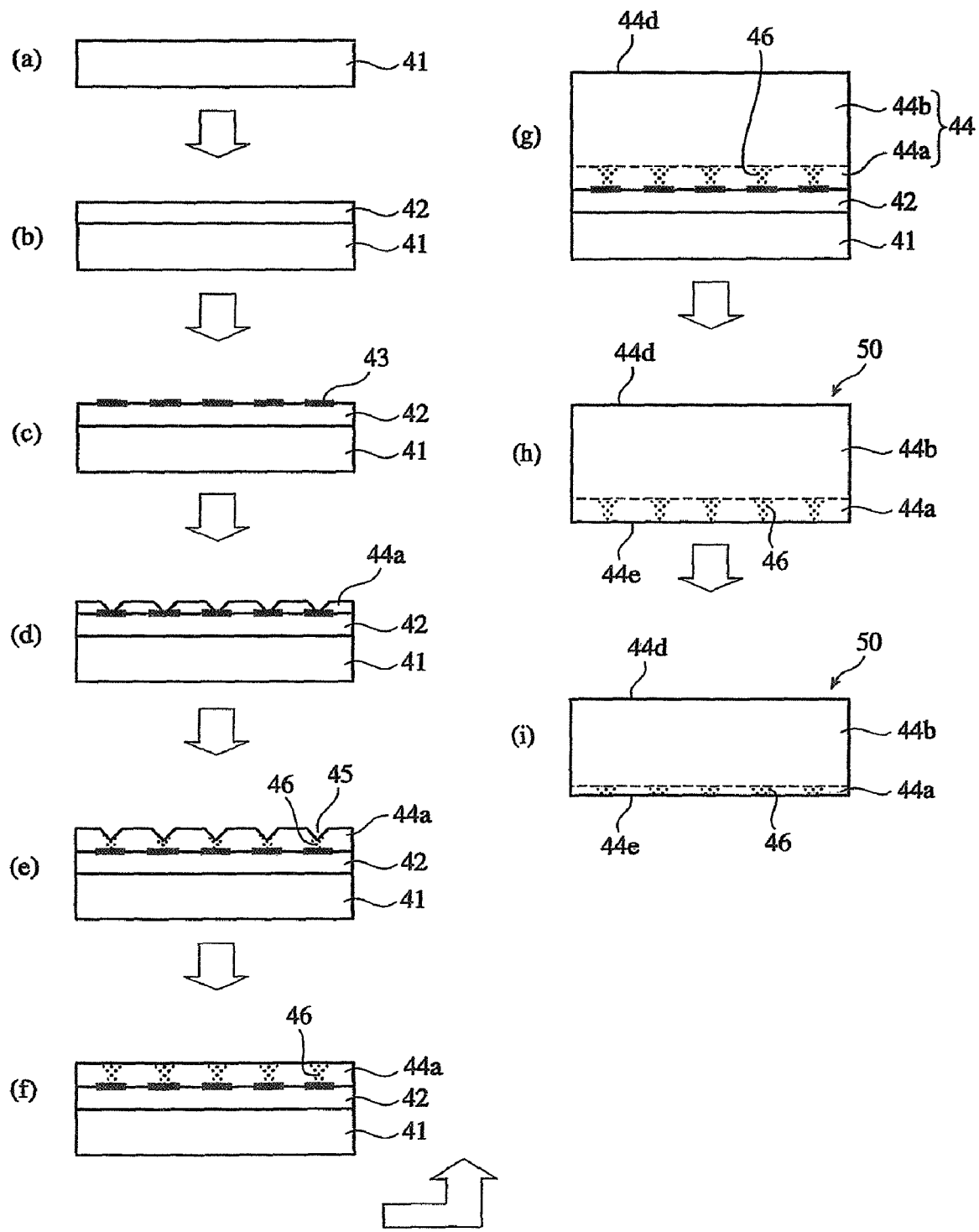
FIG. 9 is a schematic view showing a further example of the production process of the self-supported GaN substrate of the present invention (Example 5)

An epitaxial GaN layer was grown on a sapphire substrate by the FIELO method (A. Usui, et al., Jpn. J. Appl. Phys. Vol. 36 (1997), pp. L.899-L.902), and the sapphire substrate was removed to obtain a self-supported GaN substrate for evaluation. The production method of the self-supported GaN substrate in this Example will be explained below referring to FIG. 9.

An undoped GaN layer 42 was grown to a thickness of 600 nm on a 2-inch-diameter, C-plane substrate 41 of single crystal sapphire with TMG and $NH_3$ as source gases by an MOVPE method, [step (b)]. Next, an $SiO_2$ film was deposited to a thickness of 0.5 μm on this epitaxial GaN substrate by a thermal CVD method, and an $SiO_2$ film was provided with windows in stripes in parallel to <11-20> by photolithography, to expose the GaN layer 42 [step (c)]. The width of each window was 3 μm, and the width of an $SiO_2$ mask 43 was 7 μm.

This substrate was placed in an HVPE furnace, and a GaN crystal 44 was grown to a total thickness of 500 μm. Source gases used for the crystal growth were $NH_3$ and GaCl, and a carrier gas used was a mixed gas of 5% $H_2$ and 95% $N_2$. The growth conditions were normal pressure and a substrate temperature of 1040° C. The partial pressures of GaCl and $NH_3$ in the gas supplied were $8\times10^{-3}$ atm and $5.6\times10^{-2}$ atm, respectively, at the time of starting crystal growth, to provide a V/III ratio of 7. $SiH_2Cl_2$ as a doping gas was supplied onto the substrate in the course of the growth of the GaN crystal, so that the substrate was doped with Si.

A GaN crystal 44 was first grown selectively on the underlying GaN layer exposed to the windows in stripes in parallel to <11-20>. The cross section of the GaN crystal 44 perpendicular to <11-20> was as schematically shown in (d).

When the windows of the mask were buried, a GaN crystal 44a was grown in lateral directions on the $SiO_2$ mask 43 such that it covered the entire surface of the substrate. At this time, facet planes appeared on the sidewalls of the GaN crystal 44a extending in stripes, and grooves 45 having a V-shaped cross section appeared in regions in which adjacent crystals met [step (e)]. This was confirmed by the microscopic observation of the surface and cross section of the substrate taken out of the furnace after different growth time periods.

In a fluorescent photomicrograph of a sample having a cross section corresponding to the step (e), there were dark regions 46 from the interface with the $SiO_2$ mask 43 to the bottoms of the V-shaped grooves 45 existing on the GaN surface. These regions 46 contained a small amount of a dopant, with a lower carrier concentration than the surroundings.

As the crystal-growing time went, crystal growth progressed with the above-described V-shaped grooves 45 remained on the growth interface. These grooves 45 were gradually buried as growth progressed, and when the thickness of the GaN crystal 44a exceeded 100 μm, a GaN layer having a flat surface was obtained [step (f)].

After the growth interface of the GaN crystal 44a became flat, the growth of GaN crystal 44b was further continued to a thickness of about 400 μm. The fluorescent microscopic observation of the cross section of the GaN crystal indicated that there were no new different-brightness regions generated in a layer grown after the growth interface became flat. Namely, it was observed that the different-brightness regions 46 were terminated in the middle of the GaN crystal 44 [step (g)], without reaching the outermost surface 44d of the crystal.

The GaN crystal 44 having a total thickness of about 500 μm was thus obtained. The average growth speed of the GaN crystal 44 was about 75 μm/h. This substrate was taken out of the reaction tube, and the sapphire substrate 41 was removed by the above-described laser lift-off method, to obtain a self-supported GaN substrate 50 [step (h)].

Figure 10:
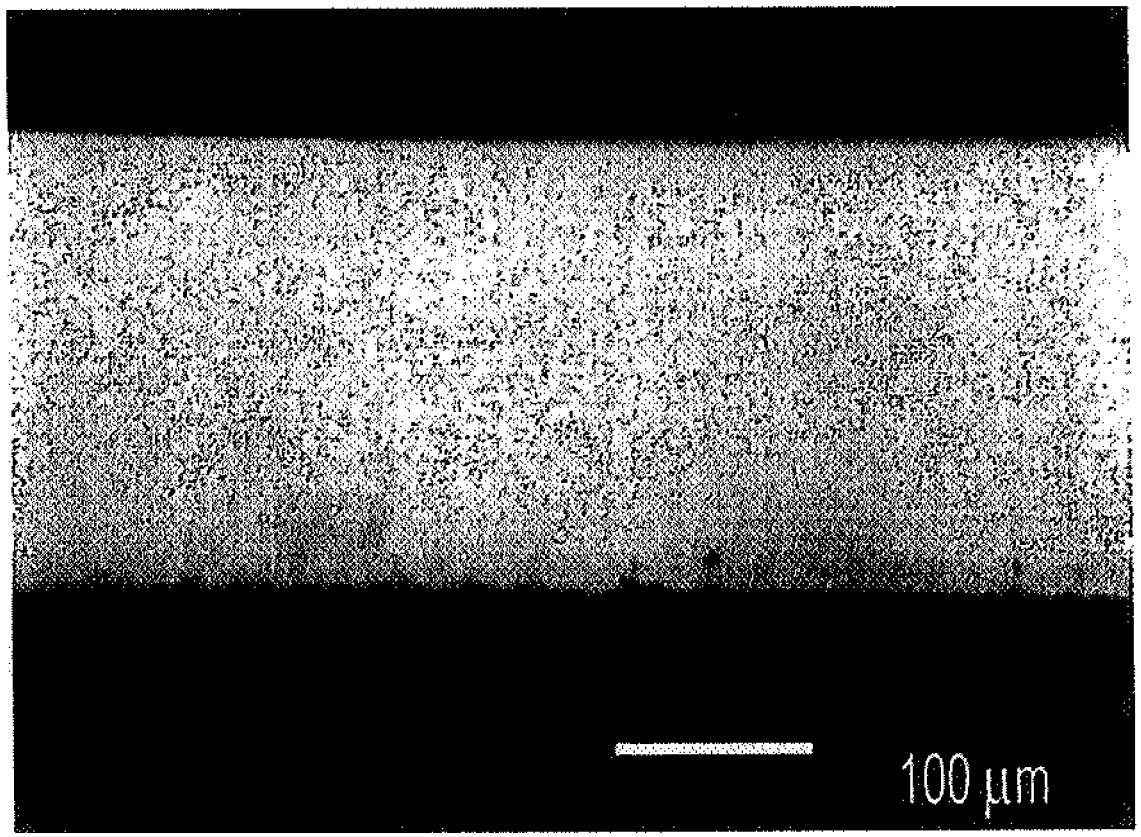
FIG. 10 is a fluorescent photomicrograph showing a cross section of the self-supported GaN substrate of the present invention (Example 5)

The self-supported GaN substrate 50 was mirror-polished on both top and bottom surfaces 44d, 44e to remove top and bottom surface portions to depths of 20 μm and 60 μm, respectively, to improve its flatness [step (i)]. The final thickness of the self-supported GaN substrate 50 was 420 μm. The fluorescent microscopic observation of the cross section of the substrate revealed that there were no regions with different carrier concentrations in most of a top surface portion 44b (up to a thickness of 380 μm) of the substrate 50. FIG. 10 is a fluorescent photomicrograph showing the cross section of this self-supported GaN substrate 50.

The carrier concentration distribution of this self-supported GaN substrate 50 was measured on top and bottom surfaces 44d, 44e at an interval of 5 mm in a diameter direction of the substrate by a van der Pauw method. As a result, it was found that the carrier concentration on the top surface 44d of the substrate 50 was sufficiently uniform in a range of $6.6 \times 10^{17}$ cm$^{-3}$ to $7.2 \times 10^{17}$ cm$^{-3}$. On the contrary, it was found that the carrier concentration on the bottom surface 44e of the substrate 50 was largely varying from $1.7 \times 10^{17}$ cm$^{-3}$ to $7.2 \times 10^{17}$ cm$^{-3}$.

An epitaxial GaN layer was grown to a thickness of 1 μm on this self-supported GaN substrate 50 by an MOVPE method, and its surface morphology was examined. As a result, it was found that the entire surface of the epitaxial GaN layer was in a uniform mirror state.

EXAMPLE 6

Figure 11:
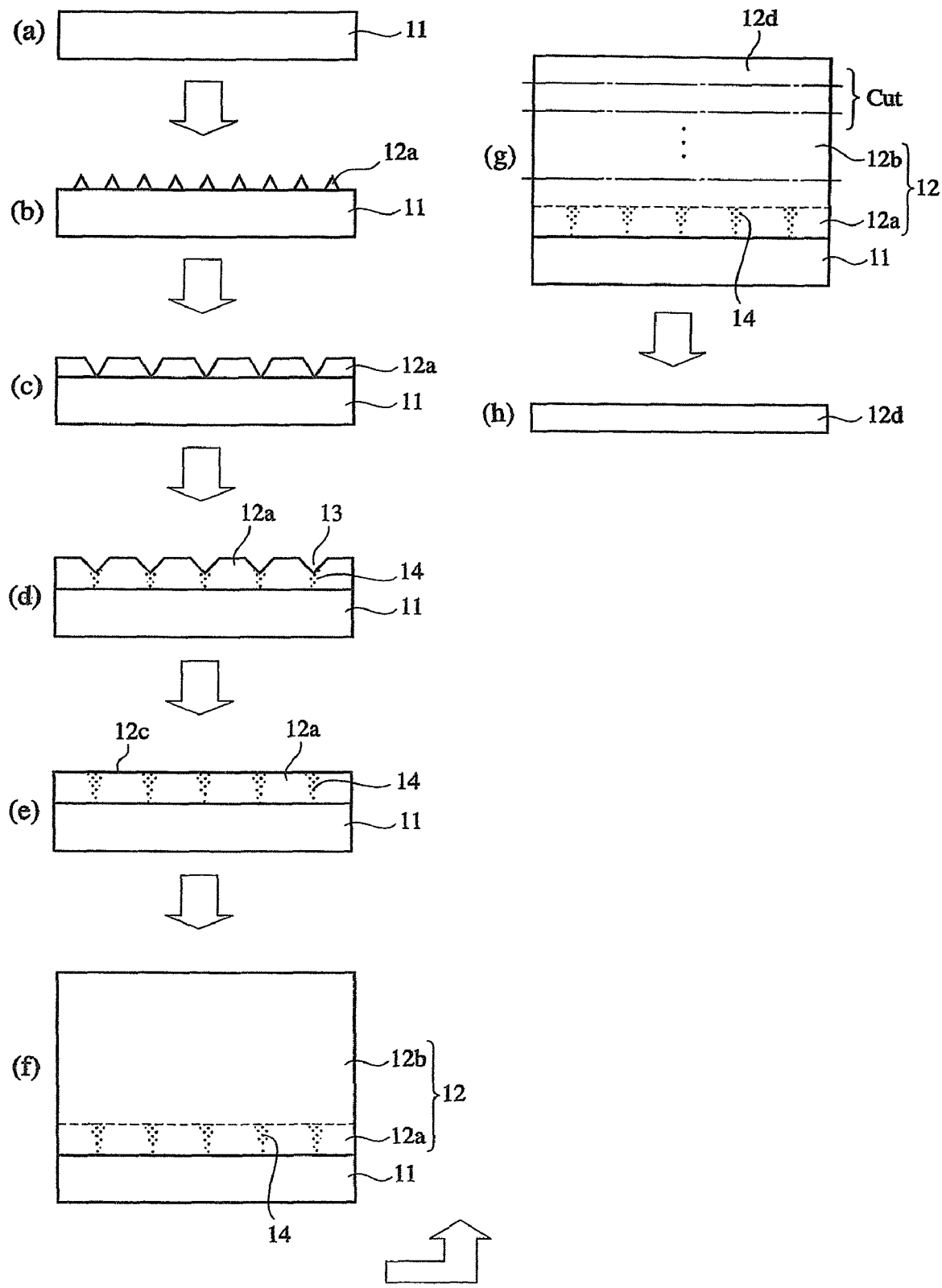
FIG. 11 is a schematic view showing a still further example of the production process of the self-supported GaN substrate of the present invention (Example 6).

A first GaN layer 12a containing regions 14 having different carrier concentrations was grown on a sapphire substrate 11 having a diameter of 50 mm by the same method and conditions as in Example 1 as shown in FIG. 11 [steps (a) to (d)], and a growth interface 12c was then caused to become flat [step (e)], so that a second GaN layer 12b having a uniform carrier concentration was grown [step (f)]. What is different from Example 1 is that a second GaN layer 12b having a uniform carrier concentration was continuously grown to a thickness of about 20 mm.

The second GaN layer 12b having a thickness of about 20 mm with the sapphire substrate 11 still attached thereto was mounted to a jig, and cut by a wire saw electrodeposited with abrasive diamond grains. The cutting of the GaN crystal 12b was conducted perpendicularly to the crystal growth direction (in parallel to the surface of the sapphire substrate 11) [step (g)]. Thus, 19 GaN substrates 12d of 50 mm in diameter and 450 μm in thickness were cut out from the second thick-grown GaN layer 12b. Each cutout GaN substrate was mirror-polished on both top and bottom surfaces to obtain a colorless, transparent, self-supported GaN substrate 12d [step (h)].

The fluorescent microscopic observation of arbitrary surface and cross section of each self-supported GaN substrate 12d thus obtained indicated that it contained no different-brightness regions at all.

The carrier concentration distribution of each self-supported GaN substrate 12d thus obtained was measured on a top surface in a diameter direction of the substrate at an interval of 5 mm by the van der Pauw method. As a result, it was confirmed that the carrier concentration was sufficiently uniform in a range of $6.9 \times 10^{17}$ cm$^{-3}$ to $7.4 \times 10^{17}$ cm$^{-3}$.

An epitaxial GaN film was grown to a thickness of 2 μm on each self-supported GaN substrate 12d by an MOVPE method, and its surface morphology was observed. As a result, it was confirmed that it was in a uniform mirror state on the entire surface of the epitaxial GaN film.

Though the present invention has been explained in detail above referring to Examples, it should be noted that the present invention is not restricted thereto, and that various modifications such as combinations of each process may be included within the scope of the present invention. For instance, in Examples, the MOVPE method may be used in part of the growth of the GaN crystal. In addition, conventionally known ELO technologies using SiO$_2$ masks, etc. may be used in combination, to grow a crystal with a lot of roughness on the crystal growth interface in the initial or intermediate stage of crystal growth. Though the sapphire substrate was used as a base substrate in Examples, any substrates reported as conventional substrates such as GaAs, Si, ZrB$_2$, ZnO, etc. for epitaxial GaN layers may be used.

After removing the base substrate, the carrier concentration distribution on the surface of the GaN substrate may be made uniform by a heat treatment. This utilizes a phenomenon that atoms (or molecules) on a crystal surface are reconstructed by mass transport by keeping a GaN crystal at as high temperature as about 1000° C. In this method, however, a surface layer to be modified has a limited depth, so that such effects of homogenization as in the present invention cannot be obtained.

Though the production method of the self-supported GaN substrate is illustrated in Examples, the present invention is of course applicable to a self-supported AlGaN substrate.

According to the present invention, the self-supported III-V nitride semiconductor substrate having a low dislocation density and a substantially uniform carrier concentration on its surface can be obtained stably. The self-supported III-V nitride semiconductor of the present invention makes it possible to produce at a high yield devices such as light-emitting devices, electronic devices, etc. as designed.

What is claimed is:

1. A method for producing a III-V nitride semiconductor substrate comprising
    (a) forming a first layer having a nonuniform carrier concentration distribution by growing a III-V nitride semiconductor crystal up to a thickness of at least 80 μm while forming a plurality of projections on a crystal growth interface and continuing to grow said projections with facet planes on sidewalls at the initial or intermediate stage of crystal growth, and by further conducting said crystal growth until recesses between said projections are buried, so that said crystal growth interface becomes flat; and (b) forming a second layer having substantially uniform carrier concentration distribution by continuing said crystal growth to a thickness of 10 μm or more while keeping said crystal growth interface flat.

2. A method for producing a III-V nitride semiconductor substrate as claimed in claim 1 comprising (a) forming a first layer having a nonuniform carrier concentration distribution, by growing a III-V nitride semiconductor crystal up to a thickness of at least 80 μm while forming a plurality of projections on a crystal growth interface and continuing to grow said projections with facet plans on sidewalls at the initial or intermediate stage of crystal growth, and by further conducting said crystal growth until recesses between said projections are buried, so that said crystal growth interface becomes flat;

(b) forming a second layer having a substantially uniform carrier concentration distribution by continuing said crystal growth while keeping said crystal growth interface flat, and (c) polishing a top surface of said substrate after the completion of said crystal growth, such that a remaining second layer has a thickness of 1 μm or more; and wherein a thickness of said second layer before polishing is at least 10 μm plus a thickness removed off by polishing.

3. A method for producing a III-V nitride semiconductor substrate as claimed in claim 1 comprising the steps of forming a III-V nitride semiconductor layer on a top surface of a different substrate by epitaxial growth, and then separating said III-V nitride semiconductor layer from said different substrate, (a) wherein a first layer having a nonuniform carrier concentration distribution is formed by conducting crystal growth up to a thickness of at least 80 μm while forming a plurality of projections on a crystal growth interface and continuing to grow said projections with facet planes on sidewalls at the initial or intermediate stage of growing said III-V nitride semiconductor layer, and by further conducting said crystal growth until recesses between said projections are buried, so that said crystal growth interface becomes flat; and (b) wherein a second layer having a substantially uniform carrier concentration distribution is formed by continuing said crystal growth to a thickness of 10 μm or more while keeping said crystal growth interface flat.

4. A method for producing a III-V nitride semiconductor substrate as claimed in claim 1 comprising the steps of forming a III-V nitride semiconductor layer on a top surface of a different substrate by epitaxial growth, and then separating said III-V nitride semiconductor layer from said different substrate, (a) wherein a first layer having a nonuniform carrier concentration distribution is formed, by conducting crystal growth up to a thickness of at least 80 μm while forming a plurality of projections on a crystal growth interface and continuing to grow said projections with facet planes on sidewalls at the initial or intermediate stage of growing said III-V nitride semiconductor layer, and by further conducting said crystal growth until recesses between said projections are buried, so that said crystal growth interface becomes flat;

(b) wherein a second layer having a substantially uniform carrier concentration distribution is formed by continuing said crystal growth while keeping said crystal growth interface flat; and (c) wherein a top surface of said substrate is polished after the completion of said crystal growth, such that a remaining second layer has a thickness of 10 μm or more; and wherein a thickness of said second layer before polishing is at least 10 μm plus a thickness removed off by polishing.

5. A method for producing a III-V nitride semiconductor substrate as claimed in claim 1 comprising (a) forming a first layer having a nonuniform carrier concentration distribution, by growing a III-V nitride semiconductor crystal up to a thickness of at least 80 μm while forming a plurality of projections on a crystal growth interface and continuing to grow said projections with facet planes on sidewalls at the initial or intermediate stage of crystal growth, and by further growing said crystal until recesses between said projections are buried, so that said crystal growth interface becomes flat;

(b) forming a second layer having a substantially uniform carrier concentration distribution by continuing said crystal growth while keeping said crystal growth interface flat; and (c) removing at least part of said first layer grown while forming a plurality of projections on a crystal growth interface, after the completion of said crystal growth; and wherein at least part of said first layer is removed by polishing the bottom surface of said substrate, so that the thickness of said substrate does not become less than 200 μm.

6. A method for producing a III-V nitride semiconductor substrate as claimed in claim 1 comprising the steps of forming a III-V nitride semiconductor layer on a top surface of a different substrate by epitaxial growth, and then separating said III-V nitride semiconductor layer from said different substrate, (a) wherein a first layer having a nonuniform carrier concentration distribution is formed, by growing said III-V nitride semiconductor crystal layer up to a thickness of at least 80 μm while forming a plurality of projections on a crystal growth interface and continuing to grow said projections with facet planes on sidewalls at the initial or intermediate stage of crystal growth, and by further conducting said crystal growth until recesses between said projections are buried, so that said crystal growth interface becomes flat;

(b) wherein a second layer having a substantially uniform carrier concentration distribution is formed by continuing said crystal growth while keeping said crystal growth interface flat; and (c) wherein at least part of said first layer, which is grown while forming a plurality of projections on a crystal growth interface, is removed after the completion of said crystal growth; and wherein at least part of said first layer is removed by polishing the bottom surface of said substrate, so that the thickness of said substrate does not become less than 200 μm.

7. A method for producing a III-V nitride semiconductor substrate as claimed in claim 1 comprising (a) forming a first layer having a nonuniform carrier concentration distribution, by growing a III-V nitride semiconductor crystal up to a thickness of at least 80 μm while forming a plurality of projections on a crystal growth interface and continuing to grow said projections with facet planes on sidewalls at the initial or intermediate stage of crystal growth, and by further conducting said crystal growth until recesses between said projections are buried, so that said crystal growth interface becomes flat;

(b) forming a second layer having a substantially uniform carrier concentration distribution by continuing said crystal growth while keeping said crystal growth interface flat; and (c) cutting said second layer in a direction perpendicular to said crystal growth after the completion of said crystal growth, thereby obtaining a crystal substrate.

8. A method for producing a III-V nitride semiconductor substrate as claimed in claim 1 comprising the steps of forming a III-V nitride semiconductor layer on a top surface of a different substrate by epitaxial growth, and then separating said III-V nitride semiconductor layer from said different substrate, (a) wherein a first layer having a nonuniform carrier concentration distribution is formed, by growing said III-V nitride semiconductor layer up to a thickness of at least 80 μm while forming plurality of projections on a crystal growth interface and continuing to grow said projections with facet planes on sidewalls at the initial or intermediate stage of crystal growth, and by further conducting crystal growth until recesses between said projections are buried, so that said crystal growth interface becomes flat; (b) wherein a second layer having a substantially uniform carrier concentration distribution is formed by continuing said crystal growth while keeping said crystal growth interface flat; and (c) wherein said second layer is cut in a direction perpendicular to said crystal growth after the completion of said crystal growth, thereby obtaining a crystal substrate.

9. The method for producing III-V nitride semiconductor substrate according to claim 1, wherein recesses in the roughness formed on said crystal growth interface at the initial or intermediate stage of said crystal growth are in a V-shaped or inversed-trapezoidal shape in a cross section in parallel to said crystal growth direction, which is surrounded by facet planes.

10. The method for producing a III-V nitride semiconductor substrate according to claim 1, wherein recesses between projections formed in said crystal growth interface at the initial or intermediate stage of said crystal growth are in a conical shape surrounded by facet planes.

11. The method for producing a III-V nitride semiconductor substrate according to claim 1, wherein at least part of said crystal growth is carried out by an HVPE method.

12. The method for producing a III-V nitride semiconductor substrate according to claim 1, wherein a hydrogen concentration in a growth atmosphere gas is made higher than in the previous steps to bury the roughness of said crystal growth interface during said crystal growth.

13. The method for producing a III-V nitride semiconductor substrate according to claim 1, wherein the partial pressure of a group-III source is made higher than in the previous steps to bury the roughness of said crystal growth interface during said crystal growth.

14. The method for producing a III-V nitride semiconductor substrate according to claim 5, wherein the top surface of said substrate is mirror-polished so that the thickness of said substrate does not become less than 200 μm.

15. The method for producing a III-V nitride semiconductor substrate according to claim 5, wherein all of said first layer is removed.

16. The method for producing a III-V nitride semiconductor substrate according to claim 1, wherein both top and bottom surfaces of a cutout substrate are polished.

* * * * *